United States Patent

Gardner et al.

Patent Number: 5,904,517
Date of Patent: May 18, 1999

[54] ULTRA THIN HIGH K SPACER MATERIAL FOR USE IN TRANSISTOR FABRICATION

[75] Inventors: Mark I. Gardner, Cedar Creek; H. Jim Fulford, Jr.; Derrick J. Wristers, both of Austin, all of Tex.

[73] Assignee: Advanced Micro Devices, Inc.

[21] Appl. No.: 09/112,529

[22] Filed: Jul. 8, 1998

[51] Int. Cl.$^6$ .................................................. H01L 21/70
[52] U.S. Cl. ..................... 438/197; 438/231; 438/586; 438/595; 438/683; 438/785
[58] Field of Search ................... 438/230, 231, 438/233, 217, 585, 586, 683

[56] References Cited

U.S. PATENT DOCUMENTS

| | | | |
|---|---|---|---|
| 5,441,906 | 8/1995 | Burger | 438/217 |
| 5,668,024 | 9/1997 | Tsai et al. | 438/231 |
| 5,691,225 | 11/1997 | Abiko | 438/231 |
| 5,780,362 | 7/1998 | Wang et al. | 438/683 |
| 5,807,770 | 9/1998 | Mineji | 438/231 |

*Primary Examiner*—Olik Chaudhuri
*Assistant Examiner*—Anh D. Mai
*Attorney, Agent, or Firm*—Kevin L. Daffer; Conley, Rose & Tayon

[57] ABSTRACT

A fabrication process and integrated circuit formed thereby are provided in which relatively thin sidewall spacers extend laterally from opposed sidewall surfaces of a transistor gate conductor. The present invention contemplates forming a gate structure upon a semiconductor substrate. Lightly doped drain impurity areas may be formed in the semiconductor substrate aligned with sidewall of the gate structure. An oxygen-containing dielectric layer is deposited upon the semiconductor topography, followed by deposition of an oxidizable metal upon the dielectric layer. The oxygen-containing dielectric and the oxidizable metal are thermally annealed such that metal oxide spacers are formed adjacent sidewall surfaces of the gate structure. In an embodiment, portions of the dielectric and the metal are selectively removed prior to the anneal. In an alternate embodiment, the metal and the dielectric are annealed first, followed by selective removal of portions of the resulting metal oxide. Following spacer formation, source and drain impurity areas may be formed in the semiconductor substrate aligned with sidewall surfaces of the spacers. A metal silicide may be formed upon upper surfaces of the gate conductor and the source and drain impurity areas.

17 Claims, 4 Drawing Sheets

ULTRA THIN HIGH K SPACER MATERIAL FOR USE IN TRANSISTOR FABRICATION

BACKGROUND OF THE INVENTION

1. Field of the Invention

This invention relates to integrated circuit fabrication and, more particularly, to relatively thin sidewall spacers extending laterally from opposed sidewall surfaces of a transistor gate conductor.

2. Description of the Related Art

Fabrication of a MOSFET device is well known. Generally speaking, MOSFETs are manufactured by placing undoped polycrystalline silicon ("polysilicon") over a relatively thin gate oxide. The polysilicon material is then patterned to form a gate conductor directly above a channel region of the substrate. A dopant species is implanted into the gate conductor and regions of the substrate exclusive of the channel region, thereby forming source and drain regions adjacent to and on opposite sides of the channel region. If the dopant species used for forming the source and drain regions is n-type, then the resulting MOSFET is an NMOSFET ("n-channel") transistor device. Conversely, if the dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

While in operation, transistors which have heavily doped source and drain regions arranged laterally adjacent the gate conductor often experience a problem known as hot carrier injection ("HCI"). HCI is a phenomenon in which the kinetic energy of charged carriers (holes or electrons) within the channel region is increased as the carriers are accelerated through large potential gradients. As a result of this increase in kinetic energy, the charged carriers are injected into the gate oxide wherein they may become trapped. The greatest potential gradient, often referred to as the maximum electric field ("$E_m$"), occurs near the drain during saturated operation. As a result of carrier entrapment within the gate oxide, a net negative charge density forms in the gate oxide. The trapped charge can accumulate with time, resulting in a positive threshold shift in an NMOS transistor, or a negative threshold shift in a PMOS transistor.

To overcome problems of sub-threshold current and threshold shift resulting from HCI, an alternative drain structure known as the lightly doped drain ("LDD") is commonly used. The purpose of the LDD is to absorb some of the potential into the drain and thus reduce $E_m$. A conventional LDD structure is one in which a light concentration of dopant is self-aligned to the gate conductor followed by a heavier concentration of dopant self-aligned to the gate conductor on which a pair of sidewall spacers has been formed. The purpose of the first implant dose is to produce lightly doped sections within an active area of the substrate near the channel. The second implant dose is spaced from the channel by a distance substantially equivalent to the thickness of each sidewall spacer. The second implant dose forms heavily doped source and drain regions within the active area laterally outside the LDD areas. In this manner, the lateral thickness of each sidewall spacer dictates the length of each LDD area.

Unfortunately, the addition of LDD areas adjacent the channel adds parasitic resistance to the source-drain pathway, leading to many deleterious effects. For example, the parasitic resistance causes an increase in the value of the gate-to-source voltage, $V_{GS}$, required for the drive current, $I_D$, (i.e., current flowing between the source and drain regions of a transistor in its on-state) to reach saturation. Therefore, in order to reduce the parasitic resistance of the source-drain pathway, it has become necessary to reduce the lateral dimensions of the LDD areas. However, the length of each LDD area cannot be reduced below a specific dimension using conventional methods. In particular, the lateral thickness of the sidewall spacers used to define LDD areas generally has a limited minimum size. The sidewall spacers are typically formed by chemically-vapor depositing a layer of spacer material across the substrate and the gate conductor arranged above the substrate. The spacer material is thusly placed upon the opposed sidewall surfaces of the gate conductor, the upper surface of the gate conductor, and the upper surface of the substrate exterior to the gate conductor. The spacer material is then anisotropically etched such that it is removed from horizontally oriented surfaces faster than from vertically oriented surfaces. The duration of the anisotropic etch is preferably terminated after the spacer material has been removed from a significant portion of the horizontally oriented surfaces but before the spacer material can be completely removed from the vertically extending sidewall surfaces.

Although chemical-vapor deposition ("CVD") is not as vertically directed as physical vapor deposition, a CVD deposited material generally still tends to accumulate more quickly upon horizontally oriented surfaces than upon vertically oriented surfaces. In many instances, accumulation of the CVD deposited material is particularly poor upon tall vertical surfaces. As such, the thickness of a gate conductor, and hence the height of the sidewall surfaces which bound the gate conductor, must be maintained above, e.g., 200 Å, to ensure that the conductivity of the gate conductor is relatively high. While increasing the width of the gate conductor would also afford good conductivity of the gate conductor, it would undesirably lead to an increase in the threshold voltage, $V_T$, of the transistor employing the gate conductor. Accordingly, in order to achieve good coverage of the vertically oriented sidewall surfaces of a necessarily thick gate conductor, an adequate amount of spacer material must be deposited across the gate conductor. Reducing the lateral thickness of the sidewall spacers thus cannot be achieved by decreasing the deposition time, and hence the thickness, of the spacer material. Moreover, the lateral thickness of the sidewall spacers cannot be reduced by increasing the anisotropic etch duration of the spacer material. That is, if the anisotropic etch is allowed to proceed too long, the gate conductor and the substrate will be over-etched, undesirably resulting in a significant decrease in the thicknesses of the gate conductor and the pre-existing LDD region within the substrate. In addition to preventing the reduction of the width of the LDD areas, this inability to reduce the lateral thickness of the spacers also limits the amount of packing density that can be achieved for an integrated circuit.

It would therefore be desirable to develop a method for fabricating a transistor having sidewall spacers of relatively small width. Since the lateral thickness of the sidewall spacers employed by a transistor determines the length of the LDDs, effectively controlling spacer thickness is important if parasitic resistance is to be decreased. Sidewall spacers having lateral dimensions reduced over the lateral thicknesses of spacers formed by conventional methods may be useful for producing smaller LDD regions and thus minimizing parasitic resistance in transistors having small lateral dimensions while effectively attenuating $E_m$ and minimizing HCI.

SUMMARY OF THE INVENTION

The problems outlined above are in large part solved by the technique hereof for forming a transistor having sidewall spacers of relatively small lateral width extending laterally from opposed sidewall surfaces of a gate conductor. In one embodiment, a thin gate dielectric layer is formed upon a semiconductor substrate. The gate dielectric layer may include silicon dioxide ("oxide") that has been formed either by thermal oxidation of the underlying semiconductor substrate ("thermally grown oxide") or by chemical vapor deposition ("CVD oxide"). Alternatively, the gate dielectric layer may include a material having a dielectric constant greater than the dielectric constant of silicon dioxide (i.e., greater than about 3.8). A conductive gate layer may then be formed upon the gate dielectric layer, by, e.g., depositing a layer of polysilicon. Optical lithography may be used to define opposed sidewall surfaces of a gate conductor. Preferably, portions of the underlying gate dielectric layer are removed substantially simultaneously with the conductive gate material to form the gate conductor spaced above the semiconductor substrate by a gate dielectric.

A relatively light concentration of dopant impurities may then be forwarded into regions of the semiconductor substrate not masked by the gate conductor. In this manner, LDD areas may be formed within the semiconductor substrate self-aligned to the sidewall surfaces of the gate conductor. Subsequently, a thin (e.g., about 50 angstrom) layer of CVD oxide may be deposited across the exposed LDD areas and the gate conductor. A layer of oxidizable metal may then be deposited upon the CVD oxide layer by, e.g., sputtering. Preferably, the oxidizable metal layer is approximately 100–200 angstroms thick. Suitable oxidizable metals include tantalum and titanium.

In an embodiment, an anisotropic etch may be performed following deposition of the metal layer to remove oxidizable metal and silicon dioxide from substantially horizontal surfaces while leaving oxidizable metal and silicon dioxide adjacent the substantially vertical sidewalls of the gate conductor. A rapid thermal anneal may then be performed in an oxidizing ambient (e.g., NO or $O_2$) to convert the oxidizable metal into metal oxide. In an alternative embodiment, the rapid thermal anneal may be performed prior to the anisotropic etch step. In the latter instance, metal oxide preferably is removed from substantially horizontal surfaces while being retained on substantially vertical surfaces to form metal oxide spacers laterally adjacent sidewall surfaces of the gate conductor.

According to the present invention, a reaction at the interface between the layer of metal (preferably refractory metal) and the oxide layer forms the metal oxide. A metal oxide dielectric formed in this manner beneficially avoids many of the problems of deposited metal oxides. For example, deposited metal oxides are typically not stoichiometric, may contain oxygen vacancies, and, overall, are not sufficiently stable when deposited directly onto a silicon substrate. Moreover, precisely depositing a uniformly thin layer of metal oxide is difficult. The metal or metal-based material from which the spacers are formed is preferably tantalum or titanium. Other metals may be used, however, provided the reaction of the metal with the adjacent silicon dioxide layer forms a suitable metal oxide. Metal atoms preferably migrate from the metal layer and combine with oxygen atoms within the silicon dioxide layer.

Preferably, the entire thickness of the silicon dioxide layer is consumed by the reaction to form the metal oxide (e.g., tantalum pentoxide or titanium dioxide).

Following spacer formation, source and drain impurity areas are formed in the semiconductor substrate self-aligned with the sidewalls of the spacers laterally adjacent the LDD areas. Self-aligned metal silicide (i.e., salicide) structures may be formed upon the source and drain regions and the upper surface of the gate conductor by heating a refractory metal (e.g., titanium or cobalt) deposited across the topography, thereby causing silicon to react with the metal. The presence of the dielectric sidewall structures prevents the refractory metal from contacting and reacting with the polysilicon sidewall surfaces of the gate conductor. Further, because the metal oxide spacers are substantially free of silicon, silicide formation on the spacers is not of great concern. Thus, silicide shorting between the gate conductor and the source and drain regions is less likely to occur than when the spacers are formed of, e.g. silicon dioxide.

Spacers formed from a metal oxide have several further potential advantages over conventional silicon dioxide spacers. For example, the dopant concentration within both the LDD areas and the source and drain regions may drop as a result of the out-diffusion of dopant species. While substantial portions of the dopant species migrate into other areas of the substrate, some also migrate into the overlying sidewall spacers. The sidewalls spacers are typically composed of chemically-vapor deposited silicon dioxide ("oxide"). Oxide deposited using chemical-vapor deposition ("CVD") is typically not stoichiometric and contains oxygen vacancies. For example, CVD deposited oxide may contain molecules having one oxygen atom instead of two oxygen atoms. Absent the appropriate number of oxygen atoms, the sidewall spacers include dangling bonds that might entrap dopant species. The presence of oxygen vacancies also provides diffusion pathways through which the dopant species might migrate. Further, the Si—O bonds within the oxide are relatively weak and unstable.

Accordingly, fast-diffusing species, e.g., boron, residing in the LDD areas proximate the substrate surface tend to pass into and become incorporated within the overlying sidewall spacers during subsequent anneal steps. In this manner, the substrate surface concentration of the dopant species may be significantly reduced. Lower dopant concentrations in the junction regions lead to increased resistivity of the source and drain junctions. Unfortunately, the drive current capability of a transistor is reduced as the resistivity of the junctions increases. Metal oxides formed according to the process described herein are less likely to contain such dangling bonds. As such, depletion of dopant species from the LDD and source and drain areas is less likely to occur, thus maintaining drive current capability.

Further, metal oxides generally have dielectric constants greater than the dielectric constant of silicon dioxide. For example, the dielectric constant, K, of tantalum pentoxide is about 25, whereas the K value of silicon dioxide is about 3.8. Forming the sidewall spacers from a so-called "high-K" dielectric (i.e., a material with a dielectric constant greater than the K value of silicon dioxide) may enhance the transistor's gate fringing field effects, which in turn increase the interaction between the gate and the source and drain areas. In addition to suppressing migration of dopant species form the LDD and source and drain areas into the spacers, the gate fringing field effect beneficially protects against hot carrier injection by decreasing the impact ionization rate. As such, the high drain potential edge is moved away from the edge of the gate toward the heavily doped drain region, enlarging the effective channel length and reducing the maximum channel electric field (i.e., the driving force that produces hot carriers).

The gate fringing field effect also advantageously increases the drive current capability of a transistor. The gate fringing field increases the vertical electric field in the source-side LDD region, leading to an increased electron density there. As a consequence, the parasitic resistance of the regions under the source-side spacer decreases, resulting in a higher drive current.

BRIEF DESCRIPTION OF THE DRAWINGS

Other objects and advantages of the invention will become apparent upon reading the following detailed description and upon reference to the accompanying drawings in which.

Figure 1:
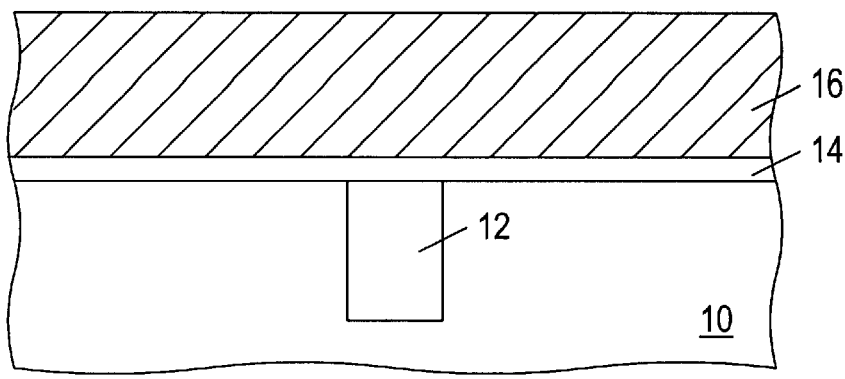
FIG. 1 depicts a partial cross-sectional view of a semiconductor topography according to an embodiment of the present invention, wherein a gate dielectric layer and a conductive gate layer haven been formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, a gate dielectric material 14 has been formed upon an upper surface of a semiconductor substrate 10. Semiconductor substrate 10 may be a single crystalline substrate slightly doped with p-type or n-type dopant species. As depicted in FIG. 1, isolation region 12 has been formed in semiconductor substrate 10. Isolation region 12 may be formed using, e.g., the well-known local oxidation of silicon ("LOCOS") or shallow trench isolation ("STI") technique.

In an embodiment, gate dielectric material 14 may include silicon dioxide thermally grown by heating an upper surface of semiconductor 10 in an oxidizing ambient. Alternatively, gate dielectric material 14 may include silicon dioxide chemical vapor deposited from, e.g., a silane- and oxygen-bearing plasma. Instead of silicon dioxide, gate dielectric material 14 may include a material having a dielectric constant K greater than the K value of silicon dioxide (i.e., greater than about 3.8). A conductive gate material may then be formed upon gate dielectric material 14. In an embodiment, conductive gate material 16 may include polycrystalline silicon ("polysilicon") chemical-vapor deposited from, e.g., a silane source. Alternatively, conductive gate material 16 may include other conductive or semiconductive materials, such as tungsten or aluminum.

Figure 2:
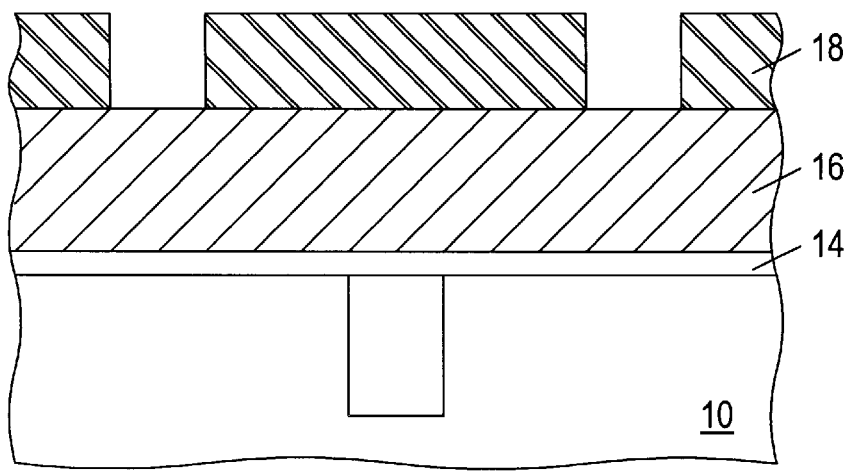
FIG. 2 depicts a partial cross-sectional view of the semiconductor topography subsequent to step 1, wherein a photoresist layer has been patterned upon the conductive gate layer.
Figure 3:
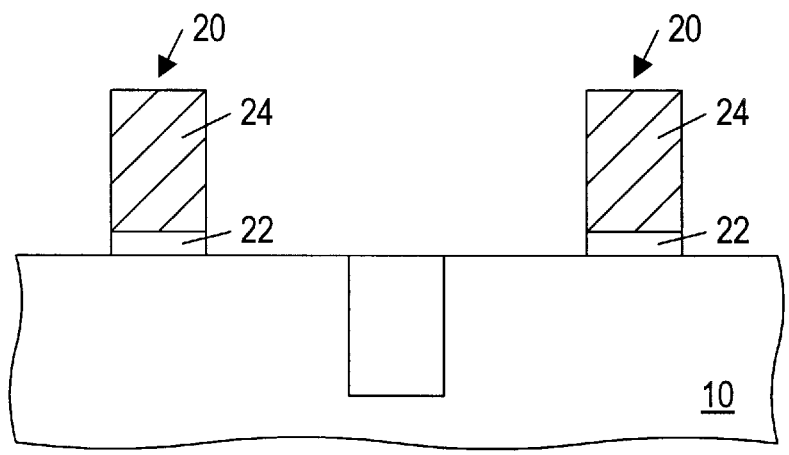
FIG. 3 depicts a partial cross-sectional view of the semiconductor topography subsequent to step 2, wherein gate structures have been formed upon a semiconductor substrate.

FIG. 2 illustrates the formation of a photoresist pattern upon the second masking material. Photoresist 18 is deposited using, e.g., chemical vapor deposition and selectively patterned and removed from above portions of the conductive gate material. Portions of the conductive gate material 16 and the gate dielectric material 14 not masked by the remaining photoresist may be removed using, e.g., an anisotropic dry plasma etch to form gate structures 20, as shown in FIG. 3. Gate structures 20 preferably include gate conductors 24 spaced above semiconductor 10 by gate dielectrics 22.

Figure 4:
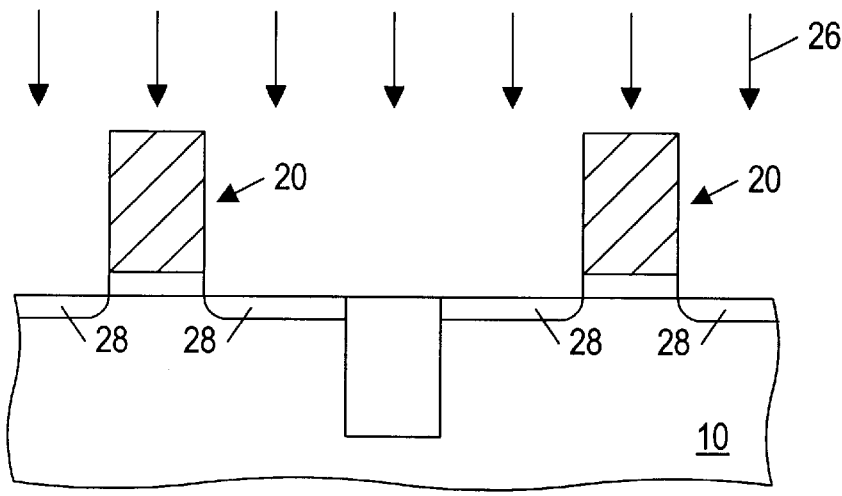
FIG. 4 depicts a partial cross-sectional view of the semiconductor topography subsequent to FIG. 3, wherein lightly doped drain impurity areas have been within the semiconductor substrate aligned with sidewall surfaces of the gate structure.
Figure 5:
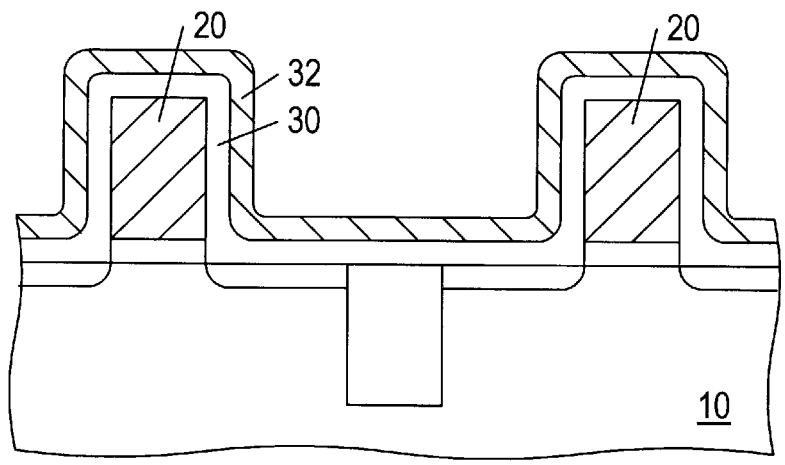
FIG. 5 depicts a partial cross-sectional view of the semiconductor topography subsequent to FIG. 4, wherein layers of silicon dioxide and oxidizable metal have been formed across the semiconductor topography.

Turning now to FIG. 4, impurity distribution 26 may be introduced into semiconductor substrate 10 to form lightly doped drain (LDD) impurity areas 28 self-aligned with sidewall surfaces of the gate structures 20. In an embodiment, impurity distribution 26 includes dopant ions forwarded into semiconductor substrate 10 using ion implantation. A dielectric layer 30 may then be formed across substrate 10 and gate structures 20, as shown in FIG. 5. Dielectric layer 30 preferably includes oxygen. A thickness of dielectric layer 30 is preferably approximately 50 angstroms. In an embodiment, dielectric layer 30 may include silicon dioxide thermally grown upon upper surfaces of semiconductor substrate 10 and gate conductors 24. CVD techniques are also available for forming silicon dioxide to ultra small thicknesses, such that dielectric layer 30 may include chemical vapor deposited silicon dioxide. A metal layer 32 may then be formed across dielectric layer 30 by, e.g., sputtering. Metal layer 32 is preferably formed to a thickness between about 100 angstroms and about 200 angstroms. Metal layer 32 is preferably an oxidizable metal; suitable metals include tantalum and titanium. Other metals may be used, however, provided the reaction of the metal with the adjacent dielectric layer forms a suitable metal oxide.

Figure 6A:
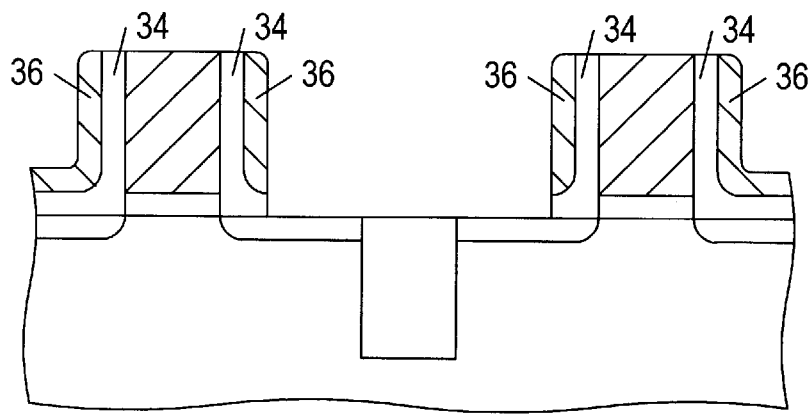
FIG. 6a depicts a partial cross-sectional view of the semiconductor topography subsequent to FIG. 5, wherein portions of the silicon dioxide and metal layers have been selectively removed from horizontal surfaces of the semiconductor topography.

According to one embodiment of the invention, an anisotropic etch may be used to selectively remove portions of metal layer 32 and dielectric layer 30 from substantially horizontal surfaces while retaining the metal and dielectric layers upon substantially vertical surfaces, as shown in FIG. 6a. Retained dielectric 34 and retained metal 36 may then be subjected to a rapid thermal anneal to form metal oxide spacers adjacent sidewall surfaces of the gate structure.

Figure 6B:
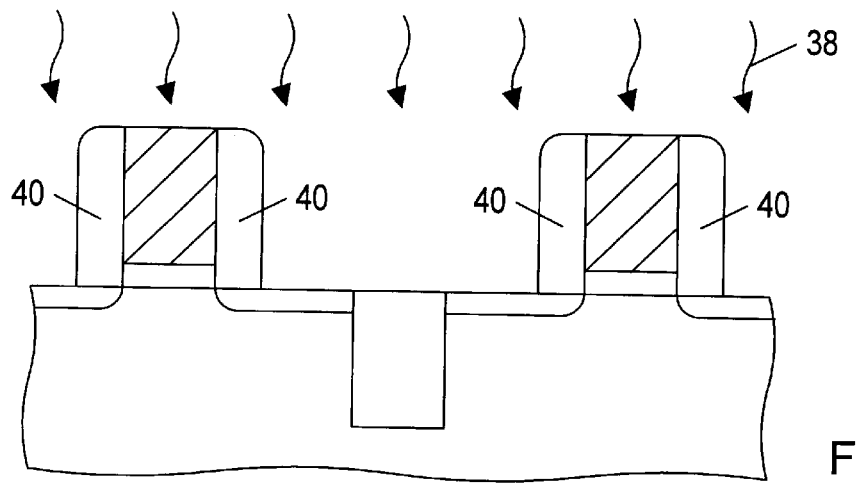
FIG. 6b depicts a partial cross-sectional view of the semiconductor topography subsequent to FIG. 6a, wherein a rapid thermal anneal has been used to form metal oxide spacers from the retained metal and silicon dioxide layers.

FIG. 6b illustrates an annealing process by which the semiconductor topography may be exposed to thermal radiation. Annealing preferably occurs in a rapid thermal processing chamber at temperatures between 700° and 950° C. for 5–60 seconds. Annealing may also occur in a tube furnace for 5–30 minutes at a temperature of 650°–850° C. The ambient in which the topography is placed is preferably an inert ambient, which may contain helium, argon, and/or nitrogen. Thermal radiation 38 preferably causes diffusion of mobile metal atoms from metal layer 36 into dielectric layer 34. Thermal radiation 38 also preferably causes diffusion of oxygen from dielectric layer 34 into metal layer 36. Preferably, metal atoms and oxygen atoms react at the interface between metal layer 36 and dielectric layer 34 to form metal oxide spacers 40. If metal layer 36 includes tantalum, then metal oxide spacers 40 preferably include tantalum pentoxide. If metal layer 36 includes titanium, then metal oxide spacers 40 preferably include titanium oxide. Metal oxide spacers 40 preferably have a thickness of approximately 150–250 angstroms [is this correct?].

Figure 7A:
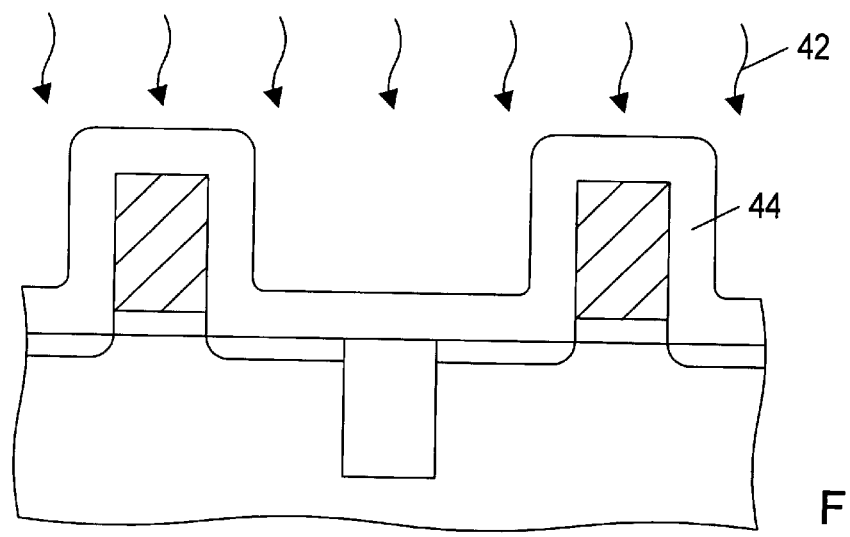
FIG. 7a depicts a partial cross-sectional view of the semiconductor topography subsequent to FIG. 5 according to an alternate embodiment, wherein a rapid thermal anneal has been used to form a metal oxide layer from the metal and silicon dioxide layers.
Figure 7B:
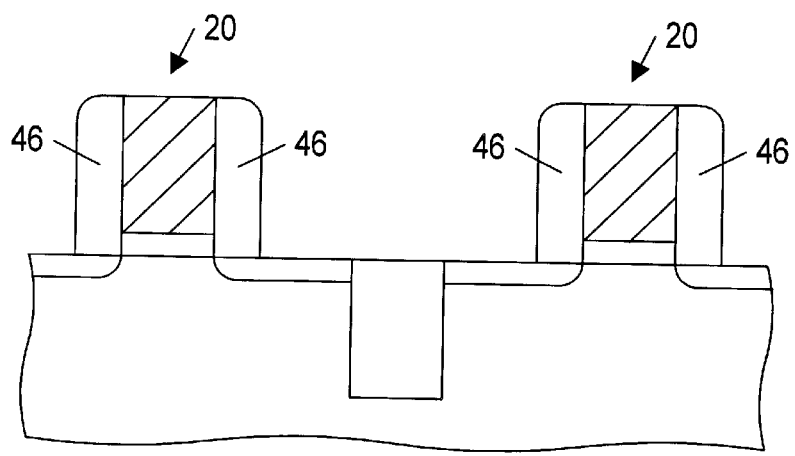
FIG. 7b depicts a partial cross-sectional view of the semiconductor topography subsequent to FIG. 7a, wherein the metal oxide has been selectively removed from horizontal surfaces of the semiconductor topography to form metal oxide spacers adjacent sidewalls of the gate conductor.
Figure 8:
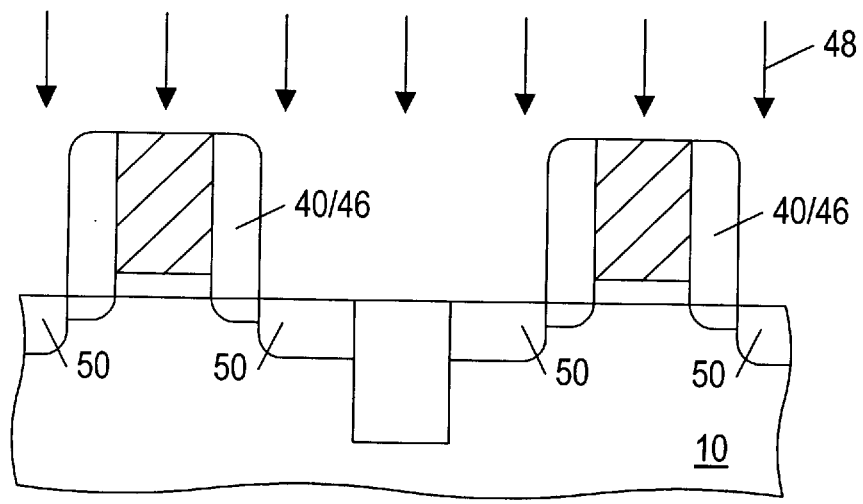
FIG. 8 depicts a partial cross-sectional view of the semiconductor topography subsequent to either FIG. 6b or FIG. 7b, wherein source and drain impurity areas have been formed within the semiconductor substrate aligned with sidewalls of the spacers.

In an alternative embodiment, the metal layer 32 and dielectric layer 30 may be subjected to an anneal prior to the anisotropic etch step, as shown in FIG. 7a. Thermal radiation 42 preferably causes diffusion of mobile metal atoms from metal layer 32 into dielectric layer 30 and diffusion of mobile oxygen atoms from dielectric layer 30 into metal layer 32, such that metal oxide layer 44 is formed across the semiconductor topography. Metal oxide layer 44 may then be anisotropically etched to form metal oxide spacers 46 adjacent sidewall surfaces of gate structure 20, as shown in FIG. 7b. Alternatively, it would be desirable to use chemical vapor deposition of a metal oxide to form the sidewall spacers 40/46. Although currently available CVD techniques appear more suitable for deposition of ultra thin layers of silicon dioxide than metal oxide, it is anticipated that further improvements in CVD methodologies will render, for example, low pressure CVD (LPCVD) and metal organic CVD (MOCVD) useful for fabricating ultra thin metal oxide dielectric layers such as those suitable for forming sidewall spacers 40/46.

Following the spacer formation steps of FIGS. 6a/b or FIGS. 7a/b, impurity distribution 48 may be forwarded into portions of semiconductor substrate 10 not masked by gate structures 20 and spacers 40/46. In an embodiment, impurity distribution 48 includes dopant ions forwarded into semiconductor substrate 10 using ion implantation. Preferably, impurity distribution is implanted at a greater concentration and energy than lightly doped drain impurity distribution 26. Heavily doped source and drain impurity areas 50 may be formed in semiconductor substrate 10 self-aligned with sidewall surfaces of spacers 40/46.

Figure 9:
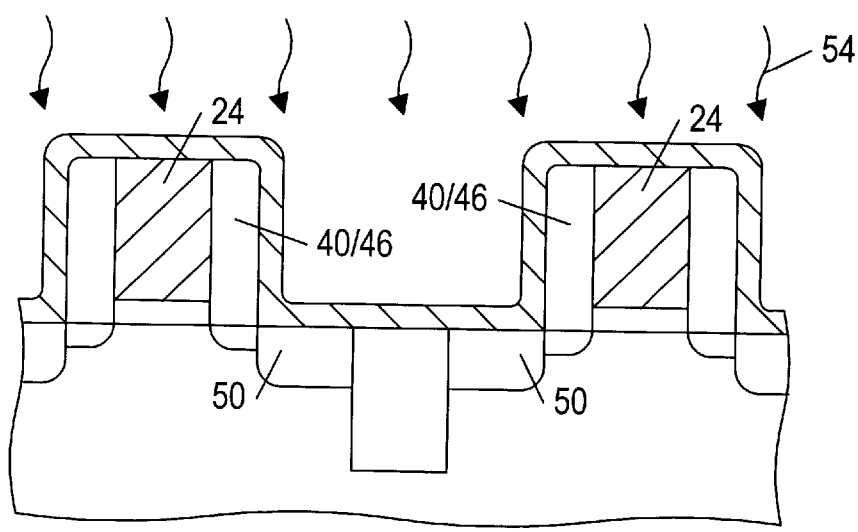
FIG. 9 depicts a partial cross-sectional view of the semiconductor topography subsequent to FIG. 8, wherein a refractory metal has been deposited across the semiconductor topography.
Figure 10:
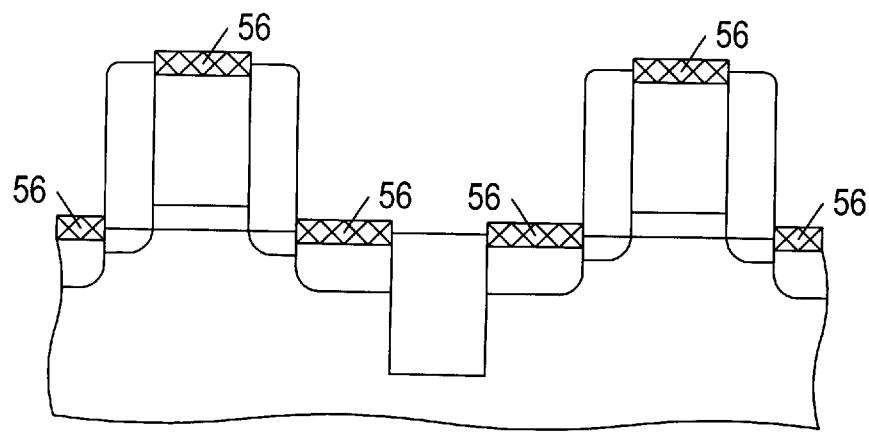
FIG. 10 depicts a partial cross-sectional view of the semiconductor topography subsequent to FIG. 9, wherein metal silicide layer shave been formed upon upper surfaces of the gate structure and the source and drain impurity areas.

FIGS. 9–10 illustrate the formation of silicide structures (e.g., $TiSi_2$ or $CoSi_2$) upon the upper surfaces of gate conductor 24 and source and drain regions 50. As shown in FIG. 9, a refractory metal 52, e.g., titanium or cobalt, is deposited across the semiconductor topography using either sputter deposition from a metal target or metal oxide CVD deposition from a gas including a metal organic-containing compound. Metal oxide sidewall spacers 40/46 are strategically placed laterally adjacent the sidewall surfaces of gate conductor 24 to inhibit refractory metal 52 from contacting the gate conductor. Metal 52 is then exposed to a form of radiation 54 supplied from either an annealing furnace or an RTA chamber. As a result of being subjected to a heat cycle, metal 52 reacts with underlying silicon of substrate 10 and polysilicon gate conductor 24 to form metal silicide structures 56. As shown in FIG. 10, unreacted portions of refractory metal 52 are then removed using an etch technique which is highly selective to the metal.

It will be appreciated to those skilled in the art having the benefit of this disclosure that this invention is believed to provide a method for forming relatively thin sidewall spacers laterally adjacent opposed sidewall surfaces of a transistor gate conductor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   forming a gate conductor spaced above a semiconductor substrate by a gate dielectric;
   forming a layer of an oxygen-containing dielectric upon said gate conductor and said semiconductor substrate;
   forming an oxidizable metal layer upon said layer of oxygen-containing dielectric; and
   annealing said oxidizable metal and said oxygen-containing dielectric to form metal oxide sidewall spacers adjacent said gate conductor.

2. The method as recited in claim 1, wherein forming said gate conductor comprises:
   forming a layer of gate dielectric material upon said semiconductor substrate;
   forming a layer of conductive gate material upon said layer of gate dielectric material; and
   patterning said gate dielectric material and said conductive gate material to form a gate conductor.

3. The method as recited in claim 2, wherein said semiconductor substrate comprises single crystalline silicon and wherein forming said layer of gate dielectric material comprises thermally growing a layer of silicon dioxide upon said semiconductor substrate.

4. The method as recited in claim 2, wherein forming said layer of gate dielectric material comprises depositing a layer of a dielectric material having a dielectric constant greater than a dielectric constant of silicon dioxide upon said semiconductor substrate.

5. The method as recited in claim 2, wherein forming said layer of conductive gate material comprises depositing polycrystalline silicon upon said gate dielectric material.

6. The method as recited in claim 2, wherein patterning said gate dielectric material and said conductive gate material comprises anisotropically etching said conductive gate material and said gate dielectric material.

7. The method as recited in claim 1, further comprising forming lightly doped drain impurity areas laterally adjacent sidewalls of said gate conductor.

8. The method as recited in claim 7, wherein forming said lightly doped drain impurity areas comprises implanting impurity ions into said semiconductor substrate.

9. The method as recited in claim 1, wherein forming said layer of oxygen-containing dielectric comprises chemical vapor depositing said oxygen-containing dielectric to a thickness of approximately 50 angstroms.

10. The method as recited in claim 1, wherein forming said layer of oxygen-containing dielectric comprises chemical vapor depositing silicon dioxide to a thickness of approximately 50 angstroms.

11. The method as recited in claim 1, wherein forming said layer of oxidizable metal comprises sputter depositing said oxidizable metal.

12. The method as recited in claim 1, wherein forming said layer of oxidizable metal comprises sputter depositing a metal selected from the group consisting of tantalum and titanium to a thickness between approximately 100 angstroms and 200 angstroms.

13. The method as recited in claim 1, wherein annealing said oxidizable metal and said oxide comprises a rapid thermal anneal in a nitrogen-bearing ambient.

14. The method as recited in claim 1, further comprising selectively removing portions of said oxidizable metal and said oxygen-containing dielectric prior to said annealing.

15. The method as recited in claim 1, further comprising selectively removing portions of said spacers subsequent to said annealing.

16. The method as recited in claim 1, further comprising forming source and drain impurity areas self-aligned with sidewall surfaces of said spacers.

17. The method as recited in claim 16, further comprising forming a metal silicide upon upper surfaces of said gate conductor and said source and drain impurity areas.

* * * * *